United States Patent [19]

Grabbe et al.

[11] E Patent Number: Re. 33,268

[45] Reissued Date of Patent: Jul. 17, 1990

[54] CHIP CARRIER SOCKET HAVING IMPROVED CONTACT TERMINALS

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 313,229

[22] Filed: Feb. 21, 1989

Related U.S. Patent Documents

Reissue of:

[64] Patent No.: 4,645,279
Issued: Feb. 24, 1987
Appl. No.: 827,133
Filed: Feb. 6, 1986

U.S. Applications:

[63] Continuation-in-part of Ser. No. 584,274, Feb. 27, 1984, abandoned.

[51] Int. Cl.[5] ..... H01R 23/72

[52] U.S. Cl. ..... 439/70; 439/525

[58] Field of Search ..... 439/68–73, 439/525, 526

[56] References Cited

U.S. PATENT DOCUMENTS

| | | | |
|---|---|---|---|
| 3,503,036 | 3/1970 | Desso et al. | 439/857 |
| 3,533,045 | 5/1968 | Henschen | 439/62 |
| 3,596,235 | 7/1979 | Teurlings et al. | 439/65 |
| 3,652,899 | 3/1972 | Henschen | 439/377 |
| 3,669,054 | 6/1972 | Desso et al. | 439/874 |
| 3,753,211 | 8/1973 | Pauza et al. | 439/329 |
| 3,754,203 | 8/1973 | Pauza et al. | 439/71 |
| 3,846,734 | 11/1974 | Pauza et al. | 439/70 |
| 3,871,736 | 3/1975 | Carter | 439/71 |
| 3,910,664 | 10/1975 | Pauza et al. | 439/71 |
| 4,018,494 | 4/1977 | Scheingold et al. | 439/330 |
| 4,089,575 | 5/1978 | Grabbe | 439/71 |
| 4,116,519 | 9/1978 | Grabbe et al. | 439/69 |
| 4,222,622 | 9/1980 | Griffin et al. | 439/71 |
| 4,268,102 | 5/1981 | Grabbe | 439/70 |
| 4,341,433 | 7/1982 | Cherian et al. | 439/525 |
| 4,354,729 | 10/1982 | Grabbe et al. | 439/71 |
| 4,370,012 | 1/1983 | Grabbe et al. | 439/325 |
| 4,370,017 | 1/1983 | Grabbe et al. | 439/862 |
| 4,402,561 | 9/1983 | Grabbe et al. | 439/66 |
| 4,426,769 | 1/1984 | Grabbe | 29/588 |
| 4,449,770 | 5/1984 | Grabbe et al. | 439/68 |
| 4,451,818 | 5/1984 | Grabbe et al. | 439/260 |
| 4,494,807 | 1/1985 | Cosmo | 439/68 |
| 4,511,197 | 4/1985 | Grabbe et al. | 439/71 |
| 4,513,353 | 4/1985 | Bakermans et al. | 439/71 |
| 4,533,192 | 8/1985 | Kelley | 439/157 |
| 4,547,031 | 10/1985 | Korsunsky | 439/325 |
| 4,630,875 | 12/1986 | Korsunsky et al. | 439/73 |
| 4,655,519 | 4/1987 | Evans et al. | 439/74 |

FOREIGN PATENT DOCUMENTS

| | | |
|---|---|---|
| 950221 | 10/1956 | Fed. Rep. of Germany . |
| 2378423 | 1/1977 | France . |
| 2365899 | 9/1977 | France . |
| 2427761 | 6/1979 | France . |
| 58-54474 | 12/1983 | Japan . |
| 1515820 | 1/1977 | United Kingdom . |
| 2025273 | 6/1978 | United Kingdom . |

*Primary Examiner*—Neil Abrams
*Attorney, Agent, or Firm*—Willian Brinks Olds Hofer Gilson & Lione

[57] ABSTRACT

Chip carrier socket has contact terminals therein comprising a web portion and first and second arms extending from the web. The first arm has a contact portion adjacent its free end for contacting a pad on a chip carrier and the second arm has a bearing portion adjacent to its free end. The intermediate portion of the second arm is not supported against wall surfaces of the chip carrier socket. The web is connected to a mounting portion by a neck which is compliantly responsive to stressing of the arms. When the contact portion engages a contact pad on a chip carrier, the entire system including the first and second arms and the web is stressed. The second arm is flexed and the freely supported end of the second arm is moved along its fixed support surface. The design permits the achievement of a high contact force and is capable of accommodating manufacturing tolerances in the chip carrier while maintaining the required contact force.

34 Claims, 5 Drawing Sheets

44
40
48
50
52
64
62
66
56
54
66
60
86
2
84
6
82
8
32
34
88
36

CHIP CARRIER SOCKET HAVING IMPROVED CONTACT TERMINALS

Matter enclosed in heavy brackets [ ] appears in the original patent but forms no part of this reissue specification; matter printed in italics indicates the additions made by reissue.

RELATED APPLICATIONS

This application is a continuation-in-part of application Ser. No. 584,274 filed Feb. 27, 1984 and now abandoned.

FIELD OF THE INVENTION

This invention relates to chip carrier sockets and the terminals contained in chip carrier sockets. The invention is particularly concerned with the problem of obtaining adequate contact force of the terminals against terminal pads on a chip carrier in the socket notwithstanding dimensional variations in the chip carrier as a result of manufacturing tolerances.

BACKGROUND OF THE INVENTION

Integrated circuits are commonly mounted in chip carriers which are bodies of insulating material having side surfaces to which conductors from the integrated circuit extend. Terminal pads are provided on the side surfaces of the chip carrier body and contact is made with these pads to connect the integrated circuit to conductors on a substrate such as a ceramic substrate or a circuit board. Contact is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals contact the terminal pads of the chip carrier.

A chip carrier socket is thus a specialized type of multicontact electrical connector. However, the design and performance requirements of a chip carrier socket exceed the requirements of previously known connectors used for connecting terminals to circuit boards or the like. Chip carriers are quite small and the terminal pads on chip carrier are commonly space apart by about 0.025 inches (0.6 mm), although chip carriers are now being proposed having a center-to-center spacing of the terminal pads of only 0.01 inches (0.25 mm). The close spacing of the terminal pads on the chip carrier requires as a general rule that the contact terminals be of the complanate type, that is that they be flat terminals having a thickness equal to the thickness of the stock metal from which they were stamped. If the chip carrier socket is intended for a chip carrier having terminal pads spaced at 0.050 inch intervals (1.3 mm), the contact terminals are commonly produced from metal stock having a thickness of 0.02 inches but it is often necessary to produce contact terminals having a thickness of 0.01 inches or less.

Chip carrier sockets commonly have a height of about 0.4 inches (10 mm) and the terminals may have a height of no more than about 0.3 inches (7 mm).

Notwithstanding the relatively small size of the chip carrier socket and the contact terminals in the socket, is is necessary that each terminal be capable of exerting of contact force on a terminal pad in a chip carrier in the range of about 200 to 400 grams in order to establish good electrical contact between the contact terminal and the terminal pad on the chip carrier, particularly if the terminal pad is tin plated rather than gold plated. Finally, chip carrier and chip carrier sockets are subject to the dimensional variations of all mass produced parts which result from manufacturing tolerances and the design and performance requirements discussed briefly above must be satisfied even in "worst case" conditions. For example, the minimum 200 gram contact force required for each contact must be met even if the particular terminal pad that a contact terminal engages is at the lower end of the tolerance range and the contact terminal similarly is at the lower of the tolerance range for the parts.

It can be appreciated from the foregoing remarks that many of the types of contact terminals used in prior art connectors are not suitable for use in chip carrier sockets and would not satisfy the requirements of a chip carrier socket terminal. The present invention is specifically directed to the achievement of an improved chip carrier socket and contact terminal which is capable of satisfying the requirement discussed above.

THE INVENTION

In accordance with one aspect thereof, the invention comprises a contact terminal of the type having a contact arm and a mounting portion, the contact arm having a contact portion for disengageably contacting a contact surface on an electrical device such as a chip carrier and the mounting portion being intended for mounting on a substrate. The contact terminal is characterized in that the terminal is a complanate or flat type terminal having oppositely facing parallel major surfaces and edge surfaces extending normally of, and between, the major surfaces. The terminal comprises a web portion having first and second arms extending therefrom in spaced-apart side-by-side relationship, the arms having free ends which are spaced from the web portion. The first arm is the contact arm, the contact portion being adjacent to the free end of and the second arm has a bearing portion adjacent to its free end. An intermediate portion of the second arm is flexible in the plane of the terminal away from the first arm. The mounting portion of the terminal is spaced from the web portion and is connected to the web portion by a connecting neck which is compliantly responsive to flexure of the arms relatively towards each other and to limited movement of the web portion which might result from such flexure, so that upon supporting the bearing portion of the second arm against lateral movement away from the first arm while permitting movement of the bearing portion away from the web portion and upon thereafter engaging the contact portion with a complementary contact surface, the first arm will be deflected towards the second arm. As a result, the intermediate portion of the second arm will be flexed with accompanying movement of the bearing portion away from the web portion and the connecting neck will compliantly respond to movement of the arms and web without transmission of significant forces from the arms and the web to the mounting portion.

In accordance with a further aspect thereof, the invention comprises a chip carrier socket for an integrated chip carrier, the socket having terminals therein as described above. The chip carrier socket comprises a socket body having a chip carrier receiving recess extending into one surface thereof and having contact-receiving cavities extending into the sidewalls of the recess. The terminals are positioned in these cavities in surrounding relationship to the recess with the first arms of the terminals adjacent to the recess side surfaces so that when the chip carrier is placed in the recess, the contact portions of the first arms or contact arms of the terminals will engage and establish electrical contact with the terminal pads on the side surfaces of the chip carrier.

THE DRAWING FIGURES

THE DISCLOSED EMBODIMENT

Figure 1:
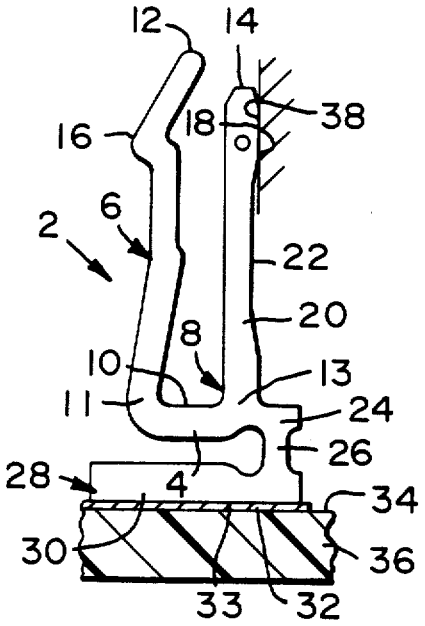
FIG. 1 is a side view of a contact terminal in accordance with one embodiment of the invention, this view also showing portions of a chip carrier socket body in which the contact terminal would be mounted and the manner in which the contact terminal is supported in the chip carrier body. This view shows the terminal in its relaxed or unstressed condition.
Figure 2:
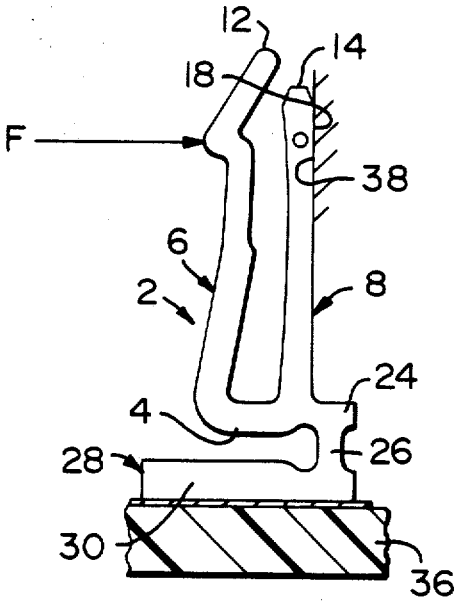
FIG. 2 is a view similar to FIG. 1 showing the positions of the parts when a contact force is applied against the contact surface of the contact terminal.
Figure 4:
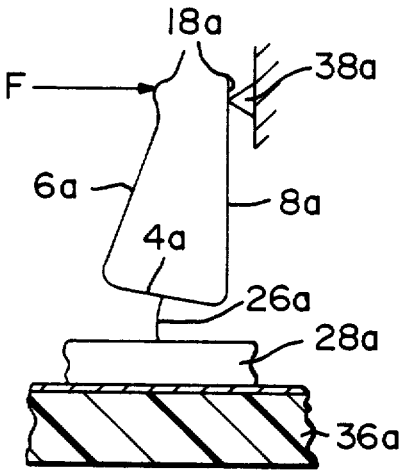
FIG. 4 is a diagram similar to FIG 3 illustrating the behavior of the contact terminal when it is stressed or under load.
Figure 5:
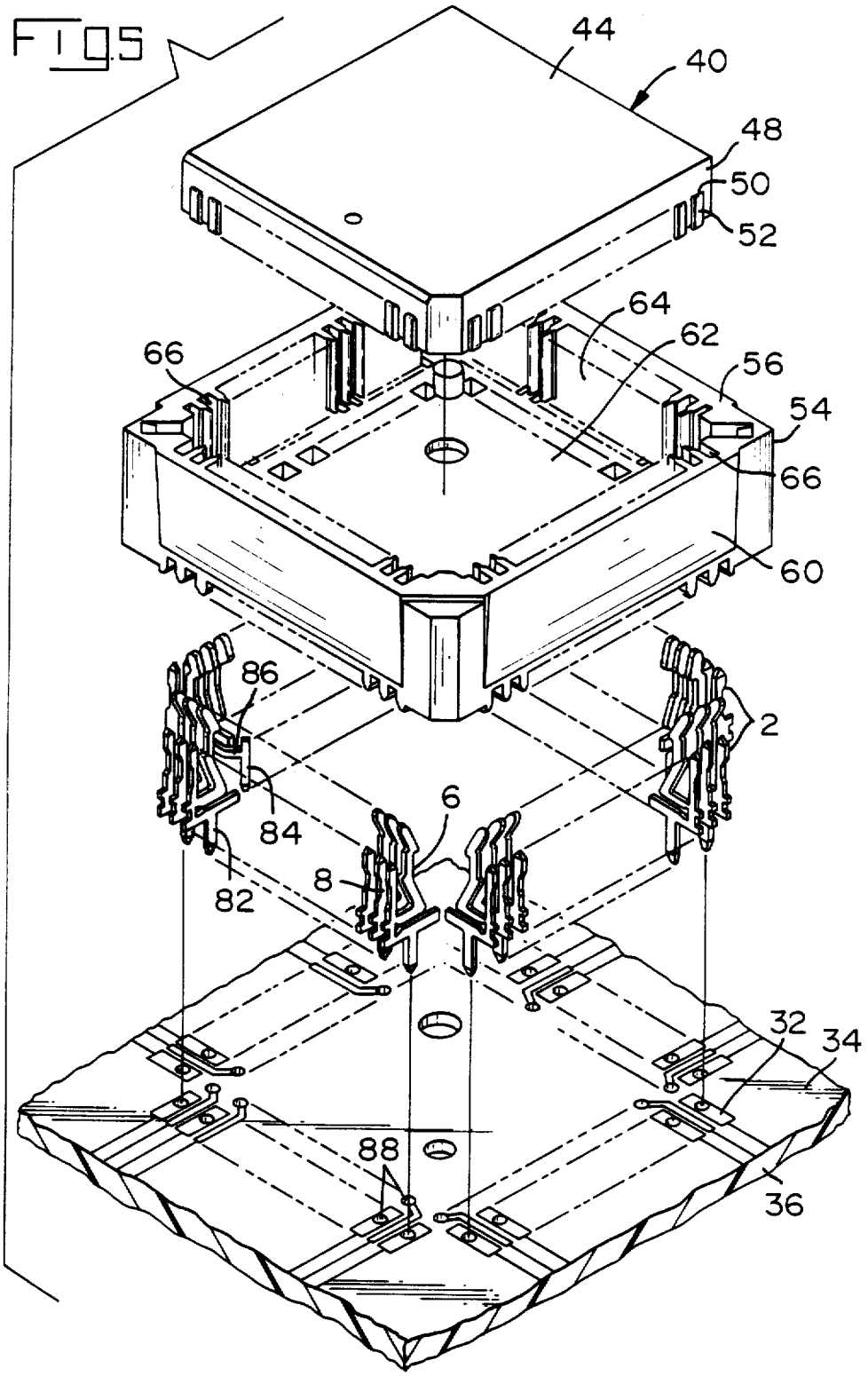
FIG. 5 is a perspective exploded view showing a chip carrier, a chip carrier socket in accordance with the invention, and a substrate.
Figure 6:
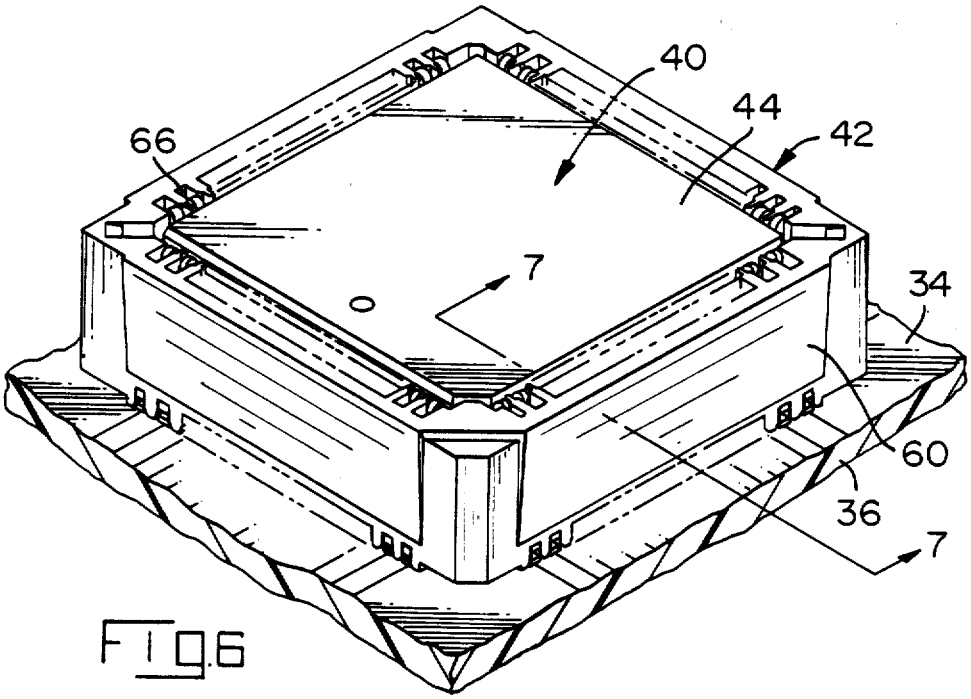
FIG. 6 is a view showing the chip carrier socket mounted on the substrate and showing the chip carrier positioned in the chip carrier socket.

FIGS. 5 and 6 show a chip carrier socket assembly 42 containing terminals 2 which contact contact pads 52 on a chip carrier 40 and which are soldered or otherwise connected to conductors on or in a substrate 36. An individual contact terminal 2 will first be described with reference to FIGS. 1 to 4 and structural details of the chip carrier socket and the chip carrier will than be described. FIGS. 1 and 2 shown semidiagrammatically structural features of the socket body which must be included with a description of the terminal.

The terminal 2 is a complanate or flat member of the type commonly produced by etching or by stamping sheet metal so that is has oppositely facing major surfaces and edges extending between the major surfaces. The thickness of the terminal as shown in FIGS. 1 and 2 may vary from about 0.005 inches to about 020 inches, depending upon requirements in a particular situation.

The contact terminal comprises a web portion 4 having first and second arms 6, 8 extending therefrom at the upper edge 10 of the web portion 4. The arms have free upper ends 12, 14 which are spaced apart but which are flexed relatively towards each other when the terminal is stressed as will be described below.

The first arm 6 is a contact arm and has a leftwardly facing, as viewed in FIG. 1, contact surface portion 16 which with the terminal pad. The second arm 8 has a rightwardly facing bearing edge surface portion 18 adjacent to its upper end which is freely supported by a surface 38 as shown. The term "freely supported" is used to emphasize the fact that the upper end portion of the arm 8 cannot move rightwardly as viewed in FIGS. 1 and 2 but it is free to move upwardly or downwardly along the support surface as will be described below. The intermediate portion 20 of the arm which is between the free end and the lower end 13 thereof is capable of flexure rightwardly from the position shown and for this purpose it is spaced from the bearing surface 38. In the embodiment shown, the edge 22 of arm 8 extends inwardly or so that the intermediate portion can be said to be bowed and the width of the arm in the intermediate portion is somewhat reduced as compared with the upper end and lower end portions to facilitate flexure rightwardly when the terminal is placed under load.

The web portion has an extension 24 extending rightwardly and this extension is connected by a neck portion 26 to a mounting portion which is generally indicated at 28 and which in the embodiment of FIG. 1 comprises a bar-like member 30 is soldered to a metallized surface 32 on the upper surface 34 of the substrate 36 so that an electrical path is provided from the contact portion 16 to this conductor 32 on the substrate.

When a contact terminal 2 is contained in a chip carrier socket which in turn is mounted on a substrate and a chip carrier is placed in the recess in the chip carrier socket as shown in FIG. 6, the effect is to impose a force F, FIG. 2, on the contact portion 16 of the contact terminal. As a result of the imposition of this force, portions of the terminal including the arms 6, 8 and the web 4 function as a spring system and the arms are flexed relatively towards each other; in fact, the arm 6 moves relatively towards the arm 8 and the arm 8 is straightened as shown in FIG. 2 with accompanying movement of the bearing edge surface 18 upwardly on the surface 38. Also, as a result of this force, the arms 6, 8 and the web 4 are rotated by an imperceptibly slight amount with respect to what might be called a pivot area which is in the vicinity of the extension 24 and the neck 26. The stresses induced in the terminal as a result of the force F are largely concentrated in the arms 6, 8 and the web 12 and only a very minor portion of the force is transmitted through the connecting neck 26 to the mounting portion 28 of the terminal. This is a highly desirable feature for the reason that it is important to avoid the development of stresses, such as shear stresses, in the soldered joint at the edge 33 of the bar-like member 30. Regardless of what type of mounting portion is provided, it is desirable to avoid stressing soldered joints when the terminal is stressed as a result of the loading shown in FIG. 2.

Figure 3:
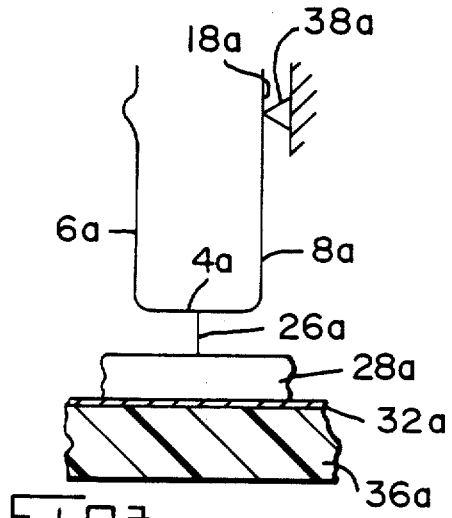
FIG. 3 is a diagram showing the general case of a contact terminal in accordance with the invention, this view showing the parts in their unstressed condition.

The diagram of FIG. 3 shows the general case of a terminal embodying the principles of the invention and illustrates, in a highly exaggerated manner, the effect of loading the terminal with the force F in FIG. 4. In this view, the reference numerals used in FIGS. 1 and 2 are applied with the addition of the letter "a" to emphasize the fact that FIGS. 3 and 4 do not literally duplicate FIGS. 1 and 2. In FIG. 3, it will be noticed that the connecting neck 26 is located between the arms 6a, 8a, rather than adjacent to the arm 8a. As will be explained below, the neck can be positioned at any desirable location and the terminal of FIGS. 1 and 2 only shows one specific embodiment.

When the force F is imposed on the contact portion 16a, it can be seen that the web 4a is tilted slightly with accompanying flexure or other deformation of the connecting neck 26a and that the angle between each of the arms 6a, 8a and the web 4a is somewhat reduced. This fact illustrates that the two arms are in fact moved relatively towards each other even though the arm 8a does not move leftwardly.

The arm 8a in FIGS. 3 and 4 is straight rather than having a reduced width intermediate section as shown in FIG. 1 but this arm is nonetheless flexed by the same amount as the arm 6a. It should be noted that arm 8a has moved downwardly in FIG. 4, a result of the fact that neck 26a is between the arms rather than in the vicinity of arm 8 as in FIG. 1.

It is emphasized that the diagrammatic views of FIGS. 3 and 4 are highly exaggerated for purposes of illustration and that the actual conditions shown in FIG. 4 could probably not be obtained in an actual contact terminal. Particularly, the amount by which the web 4a is tilted in FIG. 4 could probably not be achieved nor could the degree of flexure in the neck 26a be achieved. However, the effects shown in FIG. 4 do take place in the actual embodiment of the invention shown in FIGS. 1 and 2. Ideally, the neck 26a as shown in FIG. 4 should be completely compliantly responsive to the flexure or other movement of the arms 6a, 8a and the web 4a; these portions of the terminal constitute a spring system which under ideal conditions is independent of the mounting portion 28a and connected only by the neck 26a which serves an electrical function. In order to approach as closely as possible ideal conditions, the neck 26 can be of reduced width as shown in FIGS. 1 and 2 so that it will flex as shown in an exaggerated manner in FIGS. 3 and 4. Alternatively, the neck can be so narrow that it will actually yield (i.e. be stressed beyond its yield point and permanently deformed) when the terminal is placed in service.

Figure 7:
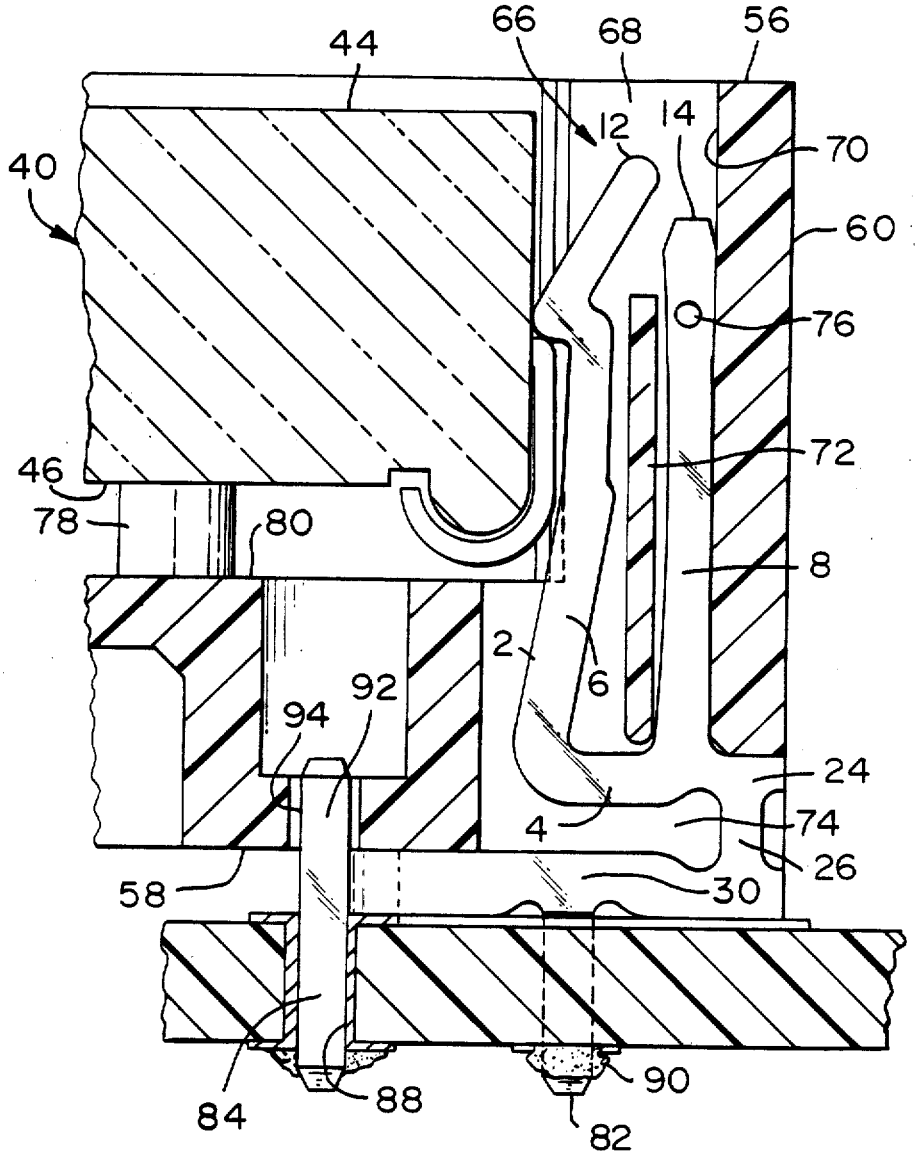
FIG. 7 is a cross-sectional view of the chip carrier socket looking in the direction of the arrow 7—7 of FIG. 6.

Turning now to FIGS. 5 and 6, the previously identified chip carrier comprises in the disclosed embodiment a generally square chip carrier body 40 having upper and lower major surfaces 44, 46, and chip carrier side surfaces 48. The leads 50 extend into the body and are connected to the integrated circuit chip therein. These leads extend downwardly along the side surface portions so that their surfaces 52 constitute the contact pads. The ends of the leads are reversely curved as shown in FIG. 7 and extend into a recess on the lower major surface 46.

The chip carrier socket 42 comprises a socket body 54 having first and second major surfaces 56, 58 and side surfaces 60. A chip carrier receiving recess 62 extends into the upper or first major surface and has recess side surfaces 64 which extend to the inner end or floor 80 of the recess. Side-by-side terminal-receiving cavities 66 extend into the side surface portions 64 and through the socket body from the upper surface 56 to the lower surface 58. Each cavity has opposed cavity sidewalls 68 and an inner end surface portion 70 which is parallel to the associated recessed side surface 64. Support surface 38 is on the upper portion of this inner end surface portion. A rib 72 extends between the sidewalls 68 and has a lower end which is proximate to an open space 74 at the lower end of the cavity. The contact terminals are inserted from below into the cavities with the second arm 8 of each terminal being in the space between the rib 72 and the inner end surface 70 of the cavity. The cavities are quite narrow between adjacent sidewalls 68 and the second arm 8 of each terminal has a boss 76 adjacent to its upper free end which provides an interference fit and limits lateral movement of each terminal in its respective cavity.

Figure 8:
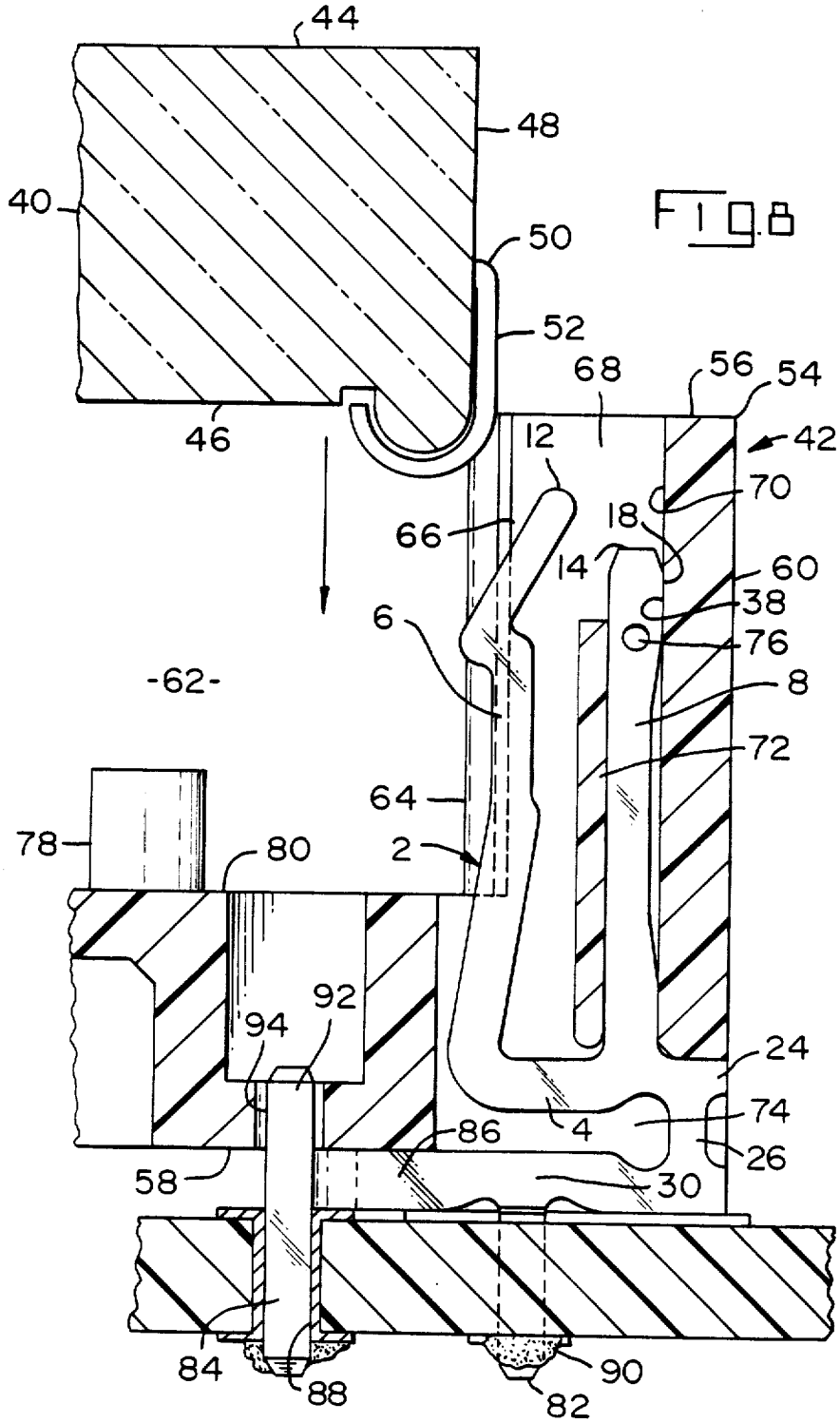
FIG. 8 is a view similar to FIG. 7 but showing the positions of the parts prior to insertion of the chip carrier into the recess in the chip carrier socket.

Standoff members 78 extend upwardly from the floor or inner end of the cavity and support the lower major surface of the chip carrier 40. The chip carrier is assembled to the chip carrier socket by merely moving the chip carrier downwardly from the position of FIG. 8 to the position of FIG. 7. During such downward movement, the individual terminals are stressed or loaded dynamically and during such movement, the force imposed on the contact portion 16 of each terminal will have a significant vertical or downward component. After the chip carrier has been fully inserted and static loading conditions prevail, the force will be substantially a s shown in FIG. 2 or will perhaps have a limited vertical component that will serve to retain the chip carrier in the cavity. An alternative configuration for the contact portion 16 of the contact terminal is described below with reference to FIG. 9.

As shown best in FIG. 5, alternate terminals in the chip carrier socket have a depending post portion 82 which is medially beneath the web of the terminal and which is received in a positioning hole 88 of the substrate. The remaining terminals have an extension 86 on the bar-like base portion 30 which is bent laterally at its end and which also has an integral positioning post 8. The extensions 86 also have an upwardly projecting post-like member 92, FIG. 7, which is received in an opening 94 in the floor of the socket housing for positioning purposes. The posts 82, 84 can be soldered as shown at 90 to conductors on the underside of the substrate or alternatively the lower edge of the bar-like portion 30 can be soldered to a conductor on the upper surface 36 of the substrate. Under some circumstances, the post portions 82, 84 might be eliminated although it is desirable to have the post portions 92 extending into the housing of the carrier socket.

Figure 9:
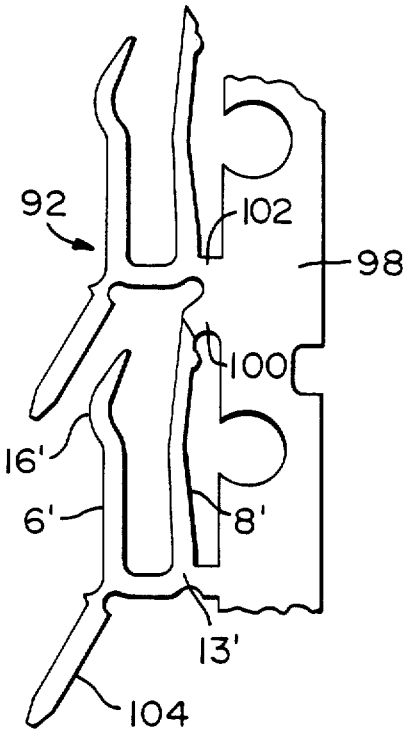
FIG. 9 is a plan view of a short section of strip having contact terminals in accordance with an alternative embodiment integral therewith.

FIG. 9 shows an alternative embodiment of a contact terminal in accordance with the invention having all of the essential features of the embodiment of FIGS 1 and 2. The reference numerals used in FIGS. 1 and 2 are also used in FIG. 9, where appropriate, and differentiated by prime marks with the structure not present in the embodiment of FIG. 1 being assigned different reference numerals. The contact terminals 92 are produced as continuous strip with each terminal being connected by a connecting section 102 to a carrier strip 98. The free end of the second arm 8′ of each contact terminal is also connected to the side of the carrier strip by a connecting section 100.

The mounting portion of the embodiment of FIG. 9 comprises a post 104 which extends obliquely from the web in the as-stamped condition, but this post can be bent either to a vertical position or to a horizontal position for surface mounting if desired. Again, the connecting neck 26′ is extremely weak and of reduced width as shown so that it will be compliantly responsive to stressing of the spring system portion of the contact terminal without transmitting stresses to the mounting portion.

It will be noted that in the embodiment of FIG. 9, the contact portion 16′ of the arm 6′ has a relatively large radius rather than the short radius of the embodiment of FIG. 1. The contact arm configuration 16′ of FIG. 9 is in fact preferable to that shown in FIG. 1.

Finally, the embodiment of FIG. 9 illustrates that the connecting neck can in fact be at different locations on the web 4′ of the terminal. The pivoting motion described above will take place with the embodiment of FIG. 9 substantially as described with reference to the diagrams of FIGS. 3 and 4.

Contact terminals for chip carrier sockets in accordance with the invention satisfy all of the requirements for such terminals and, as mentioned above, are particularly advantageous for the reason that the inevitable dimensional variations which result from manufacturing tolerances are accommodated by the terminals. This advantage of the invention stems from the fact that the U-shaped spring system comprising the arms 6, 8 and the web 4 has a relatively low spring rate which remains constant, or nearly so, over a relatively wide range of deflection in the system. A chip carrier socket in accordance with the invention can, as a result, be used with chip carriers at either of the extreme limits of dimensions which can be expected as a result of manufacturing tolerances in the chip carrier and in the socket.

We claim:

1. A chip carrier socket for an integrated circuit chip carrier, the chip carrier comprising a chip carrier body having [oppositely facing major surfaces and] outwardly facing chip carrier side surfaces [which extend normally of the major surfaces,] and spaced-apart contact pads on the chip carrier side surfaces, the socket comprising a socket body having [oppositely facing first and second major surfaces and outwardly facing socket body side surface portions,] a recess [in the first major surface] for reception of the chip carrier, [the recess having recess side surfaces which extend inwardly from the first major surface,] contact receiving cavities in the socket body in surrounding relationship to the recess, each cavity having opposed sidewalls extending inwardly from the [adjacent] recess [side surface] and an inner end surface which is remote from the recess [side surface], a contact terminal in each of the cavities, each terminal having a chip carrier contacting portion for contacting a contact pad on a chip carrier and having a substrate contacting portion for contacting a conductor on a substrate when the chip carrier socket is mounted on one surface of the substrate, [the substrate contacting portion being adjacent to the second major surface,] the chip carrier socket being characterized in that:

each contact terminal has a web portion and first and second arms extending from the web portion, the web portion being proximate to the substrate contacting portion, the arms being spaced apart [and extending towards the first major surface, the arms having free ends which are proximate to the first major surface], the first arm being adjacent to the recess, the second arm being adjacent to the inner end surface of its associated cavity, the chip carrier contacting portion being on the first arm adjacent to the free end thereof, the second arm having an intermediate portion which is spaced from the inner end surface of its associated cavity and having a supported zone adjacent to its free end, the supported zone being against [, and freely supported by,] the inner end surface, the web being connected to the substrate contacting portion by a connecting neck,

[each of the contact terminals being a flat complanate member having oppositely facing major surfaces and edge surfaces extending between the major surfaces, the chip contacting portion and the supported zone of each terminal being on the edge surfaces thereof, the contact terminals being in side-by-side relationship with the major surfaces in parallel planes which are opposed to, and substantially parallel to, the cavity sidewalls, whereby,] *such that* upon placement of a chip carrier in the recess, the chip carrier contacting portion of the terminals contact the contact pads and the first and second arms are stressed and deflected relatively towards each other thereby developing contact forces in each terminal, [the supported zone of the second arm of each terminal being moved along the inner end surface and] the intermediate portion being deflected towards the inner end surface of its associated cavity.

2. A chip carrier socket as set forth in claim 1 characterized in that the substrate contacting portion comprises a bar-like base portion which extends parallel to, and is spaced from, the web.

3. A chip carrier socket as set forth in claim 2 characterized in that the connecting neck extends between the base portion and the [neck] *web* at a location adjacent to the second arm.

4. A chip carrier socket as set forth in claim 3 characterized in that the substrate contacting portion has an integral soldering post extending therefrom which is intended to be received in a hole in the substrate and soldered to the conductor on the substrate.

5. A chip carrier socket as set forth in either of claim 1 or 4 characterized in that the recess is rectangular and is intended to receive a chip carrier having a rectangular chip carrier body.

6. A chip carrier socket as set forth in claim 5 characterized in that each of the cavities [a rib] *has an intermediate wall* extending between the sidewalls thereof, the [rib] *intermediate wall* being spaced from the inner end surface of the cavity, the second arm of the terminal in each cavity being between the [rib] *intermediate wall* and the inner end surface of the cavity.

7. A chip carrier socket as set forth in claim 6 characterized in that each of the cavities extends through the socket body from [the] *a* first major surface to [the] *a* second major surface [the rib in] *of the chip carrier body, the recess formed in the first major surface* each cavity having one end which is adjacent to the second major surface, the terminals being inserted into the cavities past the second major surface towards the first major surface.

8. A chip carrier socket as set forth in claim [1] *16* characterized in that each of the terminals is a stamped sheet metal member, the major surfaces being rolled surfaces, the edges being sheared edges.

9. A chip carrier socket as set forth in claim 1 characterized in that the connecting work of each of the terminals extends from the web thereof adjacent to the first arm, the substrate contacting portion comprising a post extending from the neck.

10. A contact terminal of the type having a contact arm and a mounting portion, the contact arm having a contact portion for disengageably contacting a contact surface on an electrical device such as a chip carrier, the mounting portion being intended for mounting on a substrate and being engageable with a conductor on the substrate, the contact terminal being characterized in that:

the terminal is a complanate type terminal having oppositely facing parallel major surfaces and edge surfaces extending normally of, and between, the major surfaces, the terminal comprises a web portion having first and second arms extending therefrom in spaced-apart side-by-side relationship, the arms having free ends which are spaced from the web portion, the first arm being the contact arm, the contact portion being adjacent to the free end thereof, the second arm having a bearing portion adjacent to its free end and an intermediate portion which is between the bearing portion and the web portion, the contact portion and the bearing portion being edge surface portions of the first and second arms respectively which face outwardly in opposite lateral directions, the intermediate portion of the second arm being flexible in the plane of the terminal away from the first arm, the mounting portion being spaced from the web portion and being connected to the web portion by a connecting neck, the connecting neck being compliantly responsive to flexure of the arms relatively towards each other and to limited movement of the web portion resulting from such flexure whereby, upon supporting the bearing portion against lateral movement away from the first arm while permitting movement of the bearing portion away from the web portion and upon engagement of the contact portion with the complementary contact surface, the first arm will be deflected towards the second arm, the intermediate portion of the second arm will be flexed with accompanying movement of the bearing portion away from the web portion, and the connecting neck will compliantly respond to movement of the arms and web without transmission of significant forces to the mounting portion.

11. A contact terminal as set forth in claim 10 characterized in that the mounting portion [is a mounting for which] extends substantially parallel to the web portion.

12. A contact terminal as set forth in claim 11 characterized in that the connecting neck extends between the web portion and the mounting bar at a location adjacent to the second arm, the terminal being intended for surface mounting on a substrate, the mounting bar being intended for soldering to a conductor on the substrate.

13. A contact terminal as set forth in claim 12 characterized in that the mounting portion comprises a post which is intended for insertion into a hole in the substrate.

14. A contact terminal as set forth in claim 13 characterized in that the connecting neck extends from the web portion to the post at a location proximate to the first arm.

15. A contact terminal as set forth in claim 10 characterized in that the intermediate portion of the second arm is inwardly bowed towards the first arm.

*16. A chip carrier socket as set forth in claim 1 characterized in that each of the contact terminals is a flat member having oppositely facing major surfaces and edge surfaces extending between the major surfaces, the chip contacting portion and the supported zone of each terminal being on the edge surfaces thereof, the contact terminals being in side-by-side relationship with the major surfaces in parallel planes which are substantially parallel to the cavity sidewalls.*

*17. A contact terminal as set forth in claim 10 characterized in that the connecting neck accommodates pivoting of the web with respect to the mounting portion.*

*18. A contact terminal of the type having a contact arm and a mounting portion, the contact arm having a contact portion for disengageably contacting a contact surface on an electrical device such as a chip carrier, the mounting portion intended for mounting on a substrate and being engageable with a conductor on the substrate, the contact terminal being characterized in that:*

*the terminal has oppositely facing parallel major surfaces and edge surfaces extending between the major surfaces;*

*the terminal comprises a web portion having first and second arms extending therefrom in spaced apart, side-by-side relationship, the arms having free ends which are spaced from the web portion;*

*the first arm being a contact arm, the contact portion being adjacent to the free end thereof, the second arm having a bearing portion;*

*the contact portion and the bearing portion being edge surface portions of the first and second arms respectively which face in opposite lateral directions;*

*the mounting portion being spaced from the web portion and being connected to the web portion by a pivot arm connecting neck.*

*19. An electrical connector comprising a connector body and at least one contact terminal mounted in the connector body, said contact terminal of the type having a contact arm and a mounting portion, the contact arm having a contact portion for disengageably contacting a contact surface on an electrical device such as a chip carrier, the mounting portion intended for mounting on a substrate and being engageable with a conductor on the substrate, the contact terminal being characterized in that:*

*the terminal has oppositely facing parallel major surfaces and edge surfaces extending between the major surfaces;*

*the terminal comprises a web portion having first and second arms extending therefrom in spaced apart, side-by-side relationship, the arms having free ends which are spaced from the web portion;*

*the first arm being a contact arm, the contact portion being adjacent to the free end thereof, the second arm having a bearing portion;*

*the contact portion and the bearing portion being edge surface portions of the first and second arms respectively which face in opposite lateral directions;*

*the mounting portion being spaced from the web portion and being connected to the web portion by a connecting neck such that the mounting portion extends alongside and outside the connector body, the mounting portion having a free end spaced from the connecting neck;*

*the mounting portion additionally having a locating portion positioned on the mounting portion between the free end and the connecting neck, said locating portion extending toward the connector body and shaped to engage the connector body to locate the mounting portion with respect to the connector body, said locating portion extending away from the substrate when the mounting portion is engaged with the conductor on the substrate.*

*20. An electrical connector comprising:*

*a connector body having a first portion adapted to lie adjacent to a substrate that supports a substrate conductor, said connector body having at least one terminal receiving portion and at least one locating element receiving portion formed therein;*

*an electrical terminal in part disposed within the terminal receiving portion of the connector body, said terminal comprising a contact portion adapted to make contact with another electrical conductor, and a mounting portion adapted to make contact with the*

*substrate conductor, said mounting portion positioned to extend outside the connector body alongside the first portion;*

*said mounting portion comprising a free end and a locating element that extends into the locating element receiving portion of the connector body, away from the substrate when the mounting portion makes contact with the substrate conductor, said locating element operative to locate the mounting portion with respect to the connector body.*

*21. An electrical connector as set forth in claim 20 wherein the mounting portion comprises a first element that extends along the first portion, wherein the locating element extends from the first element towards the connector body, and wherein the terminal further comprises a connecting portion disposed in the terminal receiving portion and situated between the contact portion and the mounting portion.*

*22. An electrical connector as et forth in claim 21 wherein the mounting portion further comprises a post portion adapted to fit into a through hole in the substrate and extending from the first element away from the connector body.*

*23. An electrical contact element which has been stamped from sheet metal stock for use with a chip carrier housing and a chip carrier having conductive pads, said contact element comprising:*

*a front beam and a rear beam extending in the same direction from a base which joins the front and rear beams, said front beam being resiliently movable toward the rear beam and comprising a contact portion for resiliently engaging a conductive pad, the rear beam resiliently engaging an inner surface of the housing and being caused to resiliently flex against said inner surface by the engagement of said front beam contact portion with said conductive pad;*

*said contact element further comprising an interconnection portion which is interconnected with the base by a pivot arm such that electrical communication is established through the front beam, the base, the pivot arm, and the interconnection portion.*

*24. An electrical contact as set forth in claim 23 wherein the interconnection portion is oriented perpendicular to and in the same plane as the front and rear beams.*

*25. An electrical contact as set forth in claim 24 wherein the contact element has been stamped from a single piece of sheet metal stock of uniform thickness and is substantially uniplanar.*

*26. An electrical contact as set forth in claim 24 wherein the front and rear beams and the base are formed substantially in the shape of a tuning fork.*

*27. An electrical contact as set forth in claim 24 wherein the interconnection portion is soldered to a conductive strip.*

*28. An electrical contact as set forth in claim 24 wherein said interconnecting portion comprises a contact pin for engaging an aperture in a printed circuit board.*

*29. An electrical contact as set forth in claim 24 wherein said interconnection portion comprises a locating portion that extends generally parallel to and in the direction of the front beam for engaging an aperture in the housing to locate the interconnection portion with respect to the housing.*

*30. A contact terminal of the type having a contact arm and a mounting portion, the contact arm having a contact portion for disengageably contacting a contact surface on an electrical device such as a chip carrier, the mounting portion being intended for mounting on a substrate and being engageable with a conductor on the substrate, the contact terminal being characterized in that:*

*the terminal has oppositely facing parallel major surfaces and edge surfaces extending between the major surfaces,*

*the terminal comprises a web portion having first and second arms extending thereform in spaced-apart side-by-*side relationship, the arms having free ends which are spaced from the web portion,

*the first arm being the contact arm, the contact portion being adjacent to the free end thereof, the second arm having a bearing portion adjacent to its free end and an intermediate portion which is between the bearing portion and the web portion,*

*the contact portion and the bearing portion being edge surface portions of the first and second arms respectively which face in opposite lateral directions, the intermediate portion of the second arm being flexible in the plane of the terminal away from the first arm,*

*the mounting portion being spaced from the web portion and being connected to the web portion by a connecting neck whereby,*

*upon supporting the bearing portion against lateral movement with respect to the first arm and upon engagement of the contact portion with the complementary contact surface, the first arm will be deflected with respect to the second arm, and the intermediate portion of the second arm will be flexed.*

*31. A contact terminal as set forth in claim 30 characterized in that the mounting portion extends substantially parallel to the web portion.*

*32. A contact terminal as set forth in claim 31 characterized in that the connecting neck extends between the web portion and the mounting bar at a location adjacent to the second arm, the terminal being intended for surface mounting on a substrate, the mounting bar being intended for soldering to a conductor on the substrate.*

*33. A contact terminal as set forth in claim 32 characterized in that the mounting portion comprises a post which is intended for insertion into a hole in the substrate.*

*34. A contact terminal as set forth in claim 30 characterized in that the intermediate portion of the second arm is inwardly bowed towards the first arm.*

* * * * *